(12) United States Patent
Lavoie et al.

(10) Patent No.: US 8,394,694 B2
(45) Date of Patent: Mar. 12, 2013

(54) RELIABILITY OF HIGH-K GATE DIELECTRIC LAYERS

(75) Inventors: Adrien R. Lavoie, Beaverton, OR (US); Aaron A. Budrevich, Portland, OR (US); Ashutosh Ashutosh, Hillsboro, OR (US); Huicheng Chang, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/725,521

(22) Filed: Mar. 19, 2007

(65) Prior Publication Data

US 2012/0286372 A1 Nov. 15, 2012

(51) Int. Cl.
*H01L 21/8238* (2006.01)
*H01L 21/02* (2006.01)

(52) U.S. Cl. ............. 438/216; 257/410; 257/E21.423; 257/E29.309

(58) Field of Classification Search .............. 438/216, 438/287, 591; 257/405, 410, E29.309, E21.423, 257/E21.625, E21.639
See application file for complete search history.

(56) References Cited

U.S. PATENT DOCUMENTS
2005/0205969 A1\* 9/2005 Ono et al. ............. 257/645

OTHER PUBLICATIONS

Lavoie, Adrien R, "Tunable Gate Electrode Work Functionmaterial for Transistor Applications", Filed: Dec. 28, 2006, U.S. Appl. No. 11/647,893.

\* cited by examiner

*Primary Examiner* — Leonard Chang
(74) *Attorney, Agent, or Firm* — Trop, Pruner & Hu, P.C.

(57) ABSTRACT

A method for improving the reliability of a high-k gate dielectric layer comprises incorporating a noble metal into a transistor gate stack that contains the high-k gate dielectric layer and annealing the transistor gate stack in a molecular hydrogen or deuterium containing atmosphere. The annealing process drives at least a portion of the molecular hydrogen or deuterium toward the high-k gate dielectric layer. When the molecular hydrogen or deuterium contacts the noble metal, it is converted into atomic hydrogen or deuterium that is able to treat the high-k gate dielectric layer and improve its reliability.

12 Claims, 6 Drawing Sheets

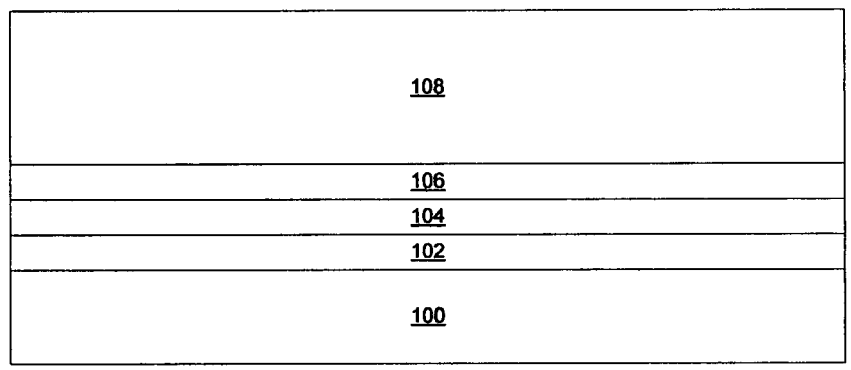
FIG._1A
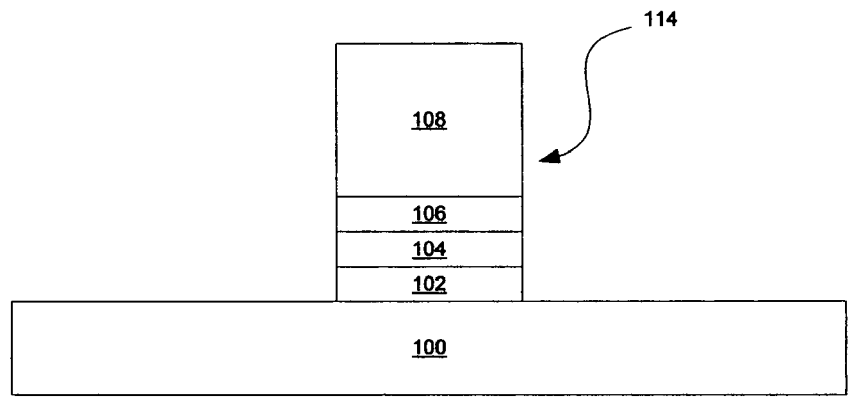
FIG._1B
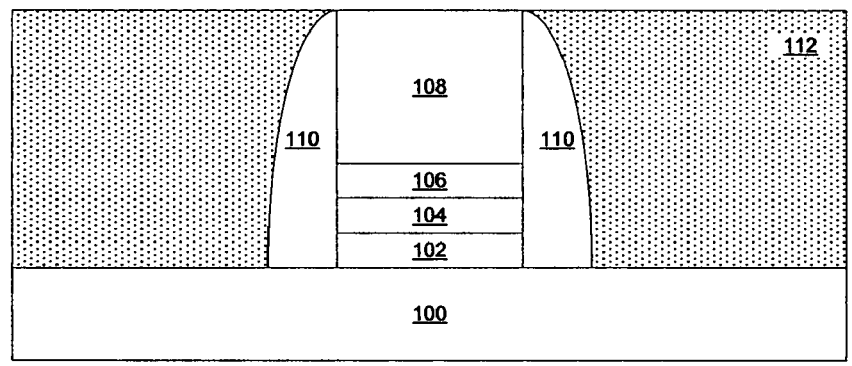
FIG._1C

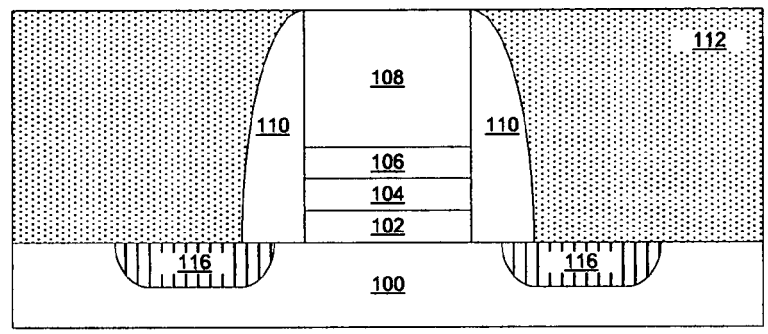
FIG._3A
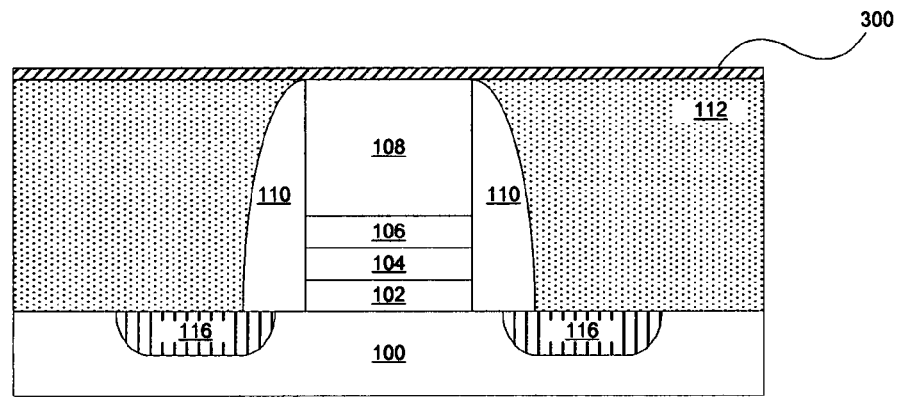
FIG._3B
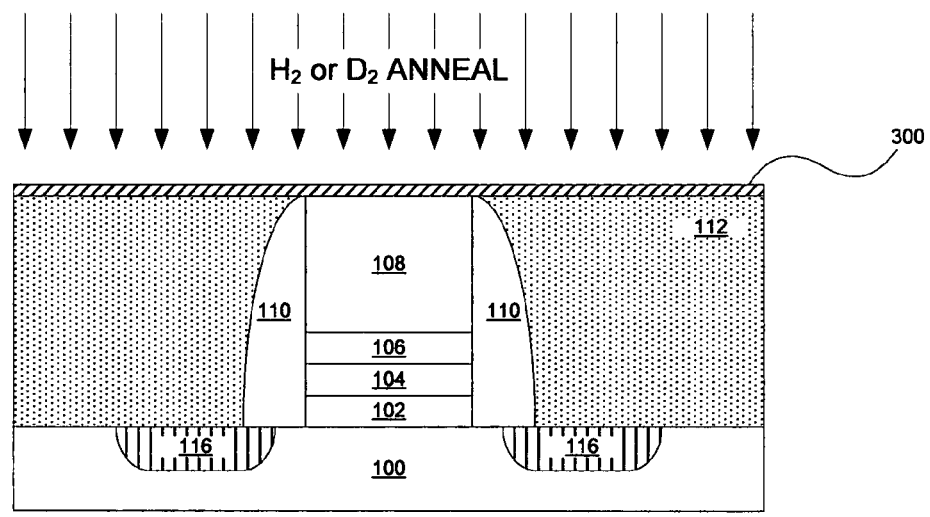
FIG._3C

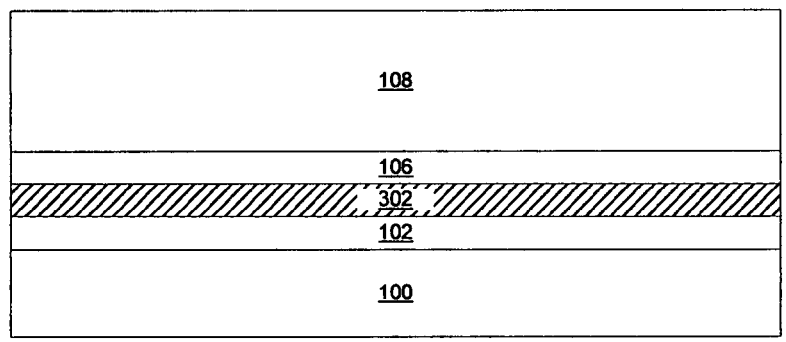
FIG._4A
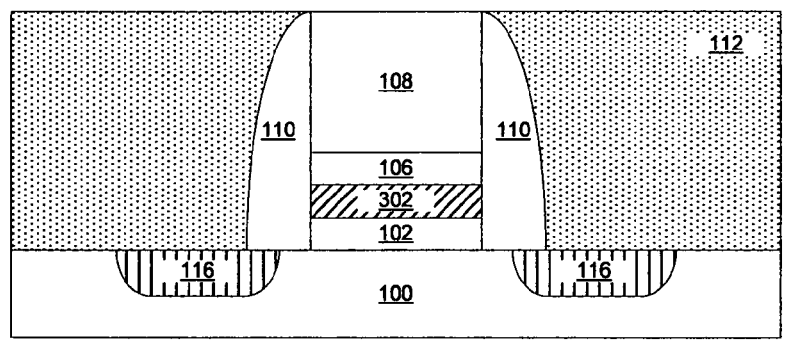
FIG._4B
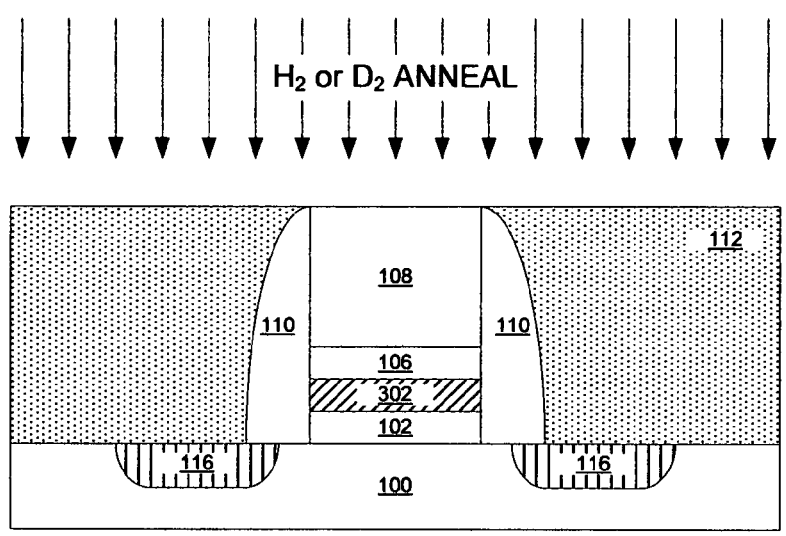
FIG._4C

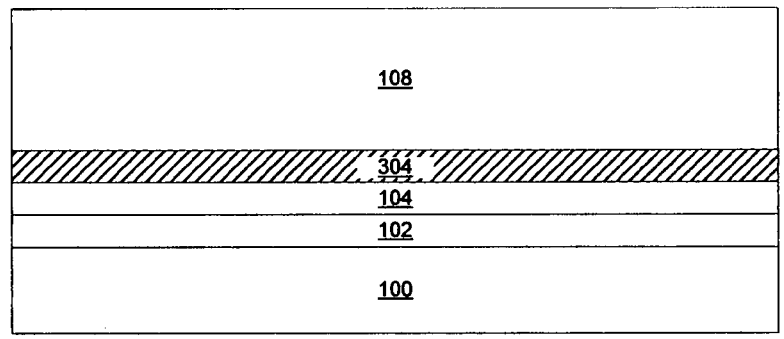
FIG. _5A
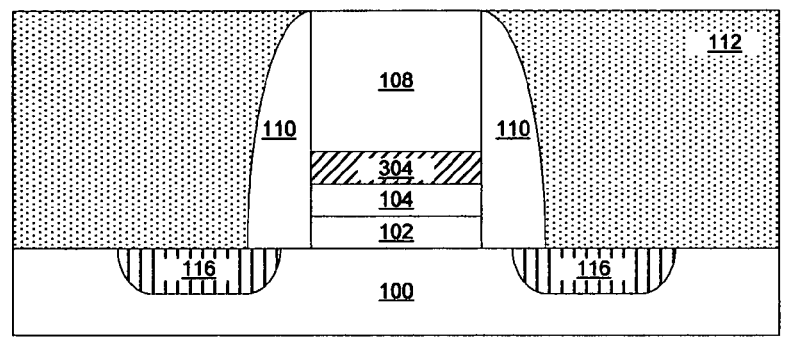
FIG. _5B
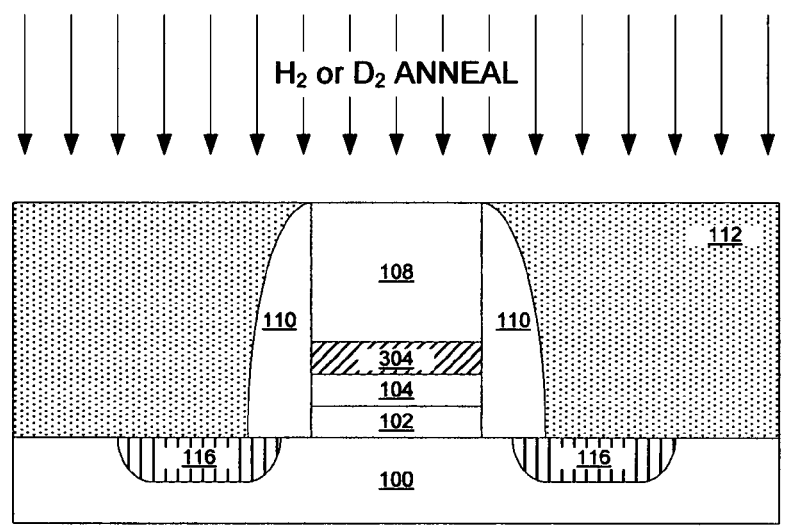
FIG. _5C

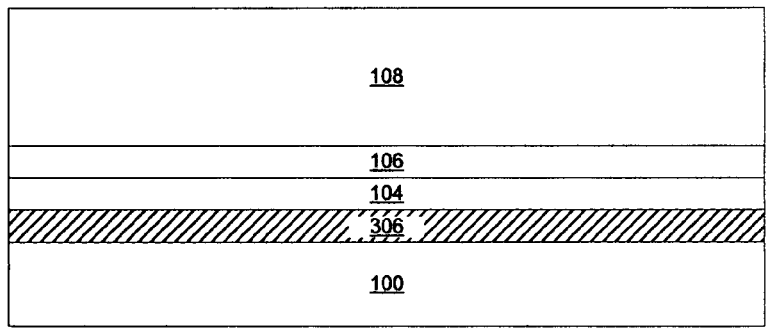
FIG._6A
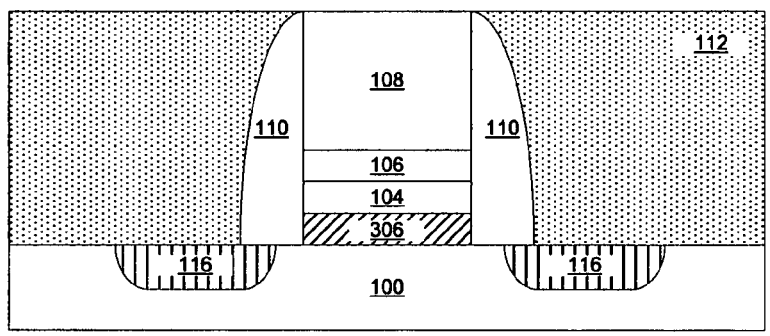
FIG._6B
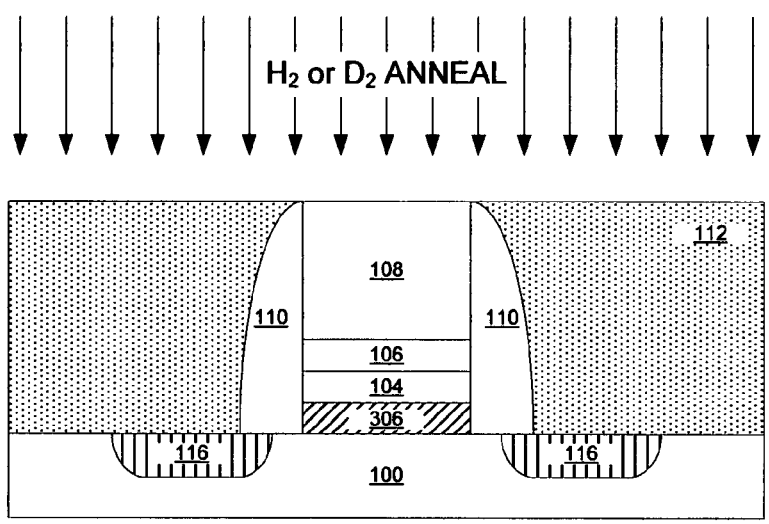
FIG._6C

RELIABILITY OF HIGH-K GATE DIELECTRIC LAYERS

BACKGROUND

In the manufacture of next generation integrated circuits, the fabrication of gate electrodes for complementary metal-oxide-semiconductor (CMOS) transistors has advanced to replace silicon dioxide and polysilicon with high-k dielectric materials and metal. A replacement metal gate process is often used to form the gate electrode. A typical replacement metal gate process begins by forming a high-k dielectric material and a sacrificial gate between a pair of spacers on a semiconductor substrate. After further processing steps, such as an annealing process, the sacrificial gate is removed and the resulting trench is filled with one or more metal layers. The metal layers can include workfunction metals as well as polysilicon electrode layers. This type of MOS transistor is often referred to as a high-k/metal gate transistor.

It has been shown that the reliability of the high-k gate dielectric layer tends to degrade over time. This is at least partially due to a high concentration of "dangling bonds" on the dielectric material, which serve as reactive sites and eventually lead to breakdown of the gate dielectric and failure of the MOS transistor. The dangling bonds therefore serve to decrease the performance, reliability, and lifetime of the transistor. Accordingly, improved methods of forming high-k/metal gate transistors are needed that can address the issue of dangling bonds in order to improve reliability in the high-k gate dielectric layer, thereby improving transistor performance and extending the life of the transistor.

BRIEF DESCRIPTION OF THE DRAWINGS

FIGS. 1A to 1C illustrate the fabrication of a gate stack for a high-k/metal gate transistor that includes a polysilicon gate electrode.

FIGS. 3A to 3C illustrate a method of treating a high-k gate dielectric layer with atomic hydrogen in accordance with an implementation of the invention.

FIGS. 4A to 4C illustrate a method of treating a high-k gate dielectric layer with atomic hydrogen in accordance with another implementation of the invention.

FIGS. 5A to 5C illustrate a method of treating a high-k gate dielectric layer with atomic hydrogen in accordance with another implementation of the invention.

FIGS. 6A to 6C illustrate a method of treating a high-k gate dielectric layer with atomic hydrogen in accordance with yet another implementation of the invention.

DETAILED DESCRIPTION

Figure 2:
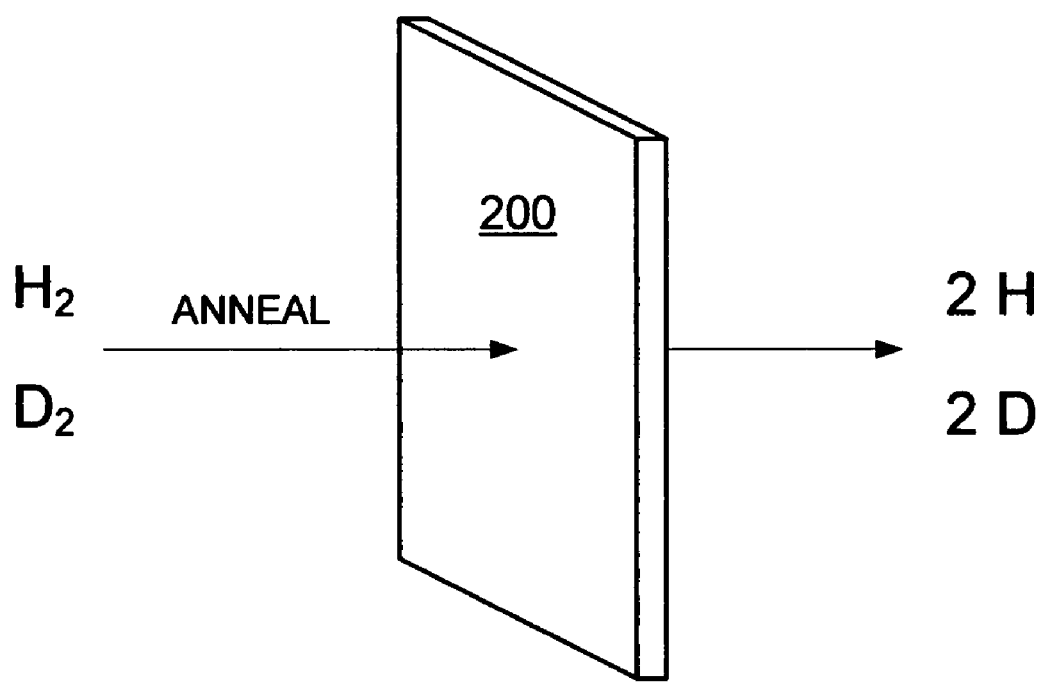
FIG. 2 illustrates a method to convert molecular hydrogen into atomic hydrogen.

Described herein are systems and methods of improving the reliability of a high-k gate dielectric layer. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As used herein, the term high-k/metal gate transistor refers to a MOS transistor that has a gate oxide formed using a high-k dielectric material and a gate electrode that includes at least one metal that is not polysilicon. A conventional process for forming such a high-k/metal gate transistor is illustrated in FIGS. 1A to 1C. Starting with FIG. 1A, a substrate 100 is shown upon which a high-k gate dielectric layer 102, a metal layer 104, an optional barrier metal layer 106, and a gate electrode layer 108 are deposited.

The substrate 100 may be formed using a bulk silicon or a silicon-on-insulator substructure. In other implementations, the substrate 100 may be formed using alternate materials, which may or may not be combined with silicon, that include but are not limited to germanium, indium antimonide, lead telluride, indium arsenide, indium phosphide, gallium arsenide, or gallium antimonide. Although a few examples of materials from which the substrate 100 may be formed are described here, any material that may serve as a foundation upon which a semiconductor device may be built falls within the spirit and scope of the present invention.

Some of the materials that may be used to form the high-k gate dielectric layer 102 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide (e.g., $HfO_2$), zirconium oxide, and aluminum oxide. Although a few examples of materials that may be used to form the high-k gate dielectric layer 102 are described here, that layer may be made from other materials. Deposition processes such as chemical vapor deposition (CVD) or atomic layer deposition (ALD) may be used to deposit the high-k gate dielectric layer 102. In various implementations of the invention, the high-k gate dielectric layer 102 may have a thickness that ranges from 5 Angstroms (Å) to 50 Å.

The metal layer 104 may be formed using any conductive material from which a metal gate electrode may be derived, and may be formed on high-k gate dielectric layer 102 using well known physical vapor deposition (PVD), CVD, or ALD processes. When the metal layer 104 will serve as an N-type workfunction metal, layer 104 preferably has a workfunction that is between about 3.9 eV and about 4.2 eV. N-type materials that may be used to form the metal layer 104 include hafnium, zirconium, titanium, tantalum, aluminum, and metal carbides that include these elements, i.e., titanium carbide, zirconium carbide, tantalum carbide, hafnium carbide and aluminum carbide. When the metal layer 104 will serve as a P-type workfunction metal, layer 104 preferable has a workfunction that is between about 4.9 eV and about 5.2 eV. P-type materials that may be used to form the metal layer 104 include ruthenium, palladium, platinum, cobalt, nickel, and conductive metal oxides, e.g., ruthenium oxide. The metal layer 104 should be thick enough to ensure that any material formed on it will not significantly impact its workfunction. Preferably, the metal layer 104 is between about 10 Å and about 300 Å thick, and more preferably is between about 10 Å and about 200 Å thick. Although a few examples of materials that may be used to form the metal layer 104 are described here, that layer may be made from many other materials.

The barrier metal layer 106, if used, may be formed using materials that include, but are not limited to, titanium nitride and tantalum nitride. The barrier layer 106 serves to protect the workfunction metal layer and the gate dielectric layer. The gate electrode layer 108 serves as a conductive fill material for the high-k/metal gate stack. The gate electrode layer 108 may be formed from materials such as polysilicon or a metal such as aluminum. In some implementations, polysilicon is used as a sacrificial gate electrode that is later replaced with a metal gate electrode. In some implementations, a sacrificial material may be used as are well known in the art.

As shown in FIG. 1B, the layers deposited on the substrate 100 are then patterned to form a gate stack 114. Patterning processes are well known in the art. For instance, one patterning process begins by depositing a photoresist material over the polysilicon layer 108 and patterning the photoresist using ultraviolet radiation and an optical mask to define features such as the gate stack 114 in the resist layer. The photoresist layer is developed to form a photoresist mask that protects the defined features, such as the portion of the underlying layers that will form the gate stack 114. An etchant is then applied to remove unprotected portions of the underlying layers, yielding a patterned gate stack 114.

Turning to FIG. 1C, a pair of spacers 110 and an ILD layer 112 are formed on the substrate 100. The spacers 110 are formed adjacent to the gate stack 114 by depositing a material, such as silicon nitride, on the substrate 100 and then etching the material to form the pair of spacers 110. After the spacers 110 are formed, a low-k dielectric material is deposited and polished to form the ILD layer 112. Low-k dielectric materials that may be used for the ILD layer 112 include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layer 112 may include pores or other voids to further reduce its dielectric constant. A source region and a drain region (not shown) may have been formed in the substrate prior to deposition of the ILD layer 112.

As mentioned above, the high-k gate dielectric layer 102 may, over time, degrade and become less reliable due to, at least in part, the reactive dangling bonds that remain on the dielectric material after it is deposited. Therefore, to improve the reliability of the high-k gate dielectric layer 102 in the high-k/metal gate transistor described above, implementations of the invention use a novel process to treat the high-k gate dielectric layer with atomic hydrogen or an isotope of hydrogen such as deuterium. The atomic hydrogen or deuterium serves to react with and eliminate the dangling bonds on the high-k dielectric layer that often lead to device failure.

FIG. 2 illustrates a method for converting molecular hydrogen ($H_2$) or deuterium ($D_2$) into atomic hydrogen (2H) or deuterium (2D). The molecular hydrogen or deuterium may be annealed in the presence of a thin noble metal catalyst layer 200. In implementations of the invention, the thin noble metal catalyst layer 100 may be a metal such as palladium (Pd), platinum (Pt), ruthenium (Ru), rhodium (Rh), osmium (Os), and iridium (Ir). These noble metals serve as effective solid phase catalysts for the activation of molecular hydrogen or deuterium into atomic hydrogen or deuterium. Therefore, during the anneal, the molecular hydrogen or deuterium is driven across the thin noble metal catalyst layer 100 where it is converted into atomic hydrogen or deuterium. This atomic hydrogen or deuterium may then be used to treat the high-k gate dielectric layer.

FIGS. 3A to 3C illustrate one implementation of the invention where a thin noble metal catalyst layer is used to treat a high-k gate dielectric layer. FIG. 3A illustrates the transistor described in FIGS. 1A to 1C, which includes a substrate 100 upon which a transistor gate stack 114 is formed. The transistor gate stack 114 includes the high-k gate dielectric layer 102, the workfunction metal layer 104, a barrier layer 106, and the gate electrode 108. The gate electrode 108 may be formed from polysilicon or it may be formed from a metal such as aluminum. The transistor also includes the spacers 110 and source and drain regions 116. An ILD layer 112 is deposited and planarized over the high-k/metal gate transistor.

Turning to FIG. 3B, a thin noble metal catalyst layer 300 is deposited over the transistor structure, for instance, on the ILD layer 112 and on the gate electrode 108. This places the noble metal in close proximity to the high-k gate dielectric layer 102. The thin noble metal catalyst layer 300 may consist of Pd, Pt, Ru, Rh, Os, or Ir and may have a thickness that ranges from around 5 Å to around 50 Å. Various deposition methods may be used to deposit the noble metal catalyst layer 300, including but not limited to chemical vapor deposition (CVD), atomic layer deposition (ALD), physical vapor deposition (PVD), electroplating, electroless plating, or a metal immobilization process (MIP), such as a palladium immobilization process (PIP), as are well known in the art.

Next, turning the FIG. 3C, an annealing process is carried out in an atmosphere that includes molecular hydrogen or deuterium. The annealing process may take place at a temperature that falls between 400° C. and 950° C. for a time duration that ranges from 5 seconds to 120 seconds. The hydrogen or deuterium may be introduced into the reactor at a flow rate that ranges from 5000 standard cubic centimeters per minute (SCCM) to 15000 SCCM.

During the annealing process, at least a portion of the molecular hydrogen or deuterium diffuses into the transistor gate through the noble metal catalyst layer 300. As the molecular hydrogen or deuterium contacts the noble metal catalyst, at least a portion of the molecular hydrogen or deuterium is converted into atomic hydrogen or deuterium. The annealing process then delivers this atomic hydrogen or deuterium down through the transistor gate stack where at least a portion of the atomic hydrogen or deuterium reaches the high-k gate dielectric layer 102. Here, the atomic hydrogen or deuterium treats the high-k dielectric material by combining with the reactive dangling bonds, rendering them passivated and substantially reducing their concentration. This quenching of the dangling bonds reduces the likelihood of device failure.

After the high-k gate dielectric layer 102 has been treated with the atomic hydrogen or deuterium and the annealing process is completed, the noble metal catalyst layer 300 may be removed. Conventional processes may be used for the removal of the noble metal layer, such as a chemical mechanical planarization (CMP) process or an etching process.

In further implementations of the invention, in lieu of a separate thin noble metal layer, a noble metal may be alloyed into a layer of the transistor gate stack to function as a catalyst for the conversion of molecular hydrogen or deuterium into atomic hydrogen or deuterium. FIGS. 4A through 4C illustrate one such implementation.

Starting with FIG. 4A, a substrate 100 is shown upon which a high-k gate dielectric layer 102, a modified workfunction metal layer 302, a barrier layer 106, and a gate electrode layer 108 are formed. The modified workfunction metal layer 302 is a workfunction metal that has been alloyed with a noble metal, thereby placing the noble metal in close proximity to the high-k gate dielectric layer 102. In some implementations of the invention, the modified workfunction metal layer 302 may be formed using a CVD or an ALD process. In some implementations, the modified workfunction metal layer 302 may be formed by alloying any of the workfunction metals listed above with a noble metal such as palladium or platinum. In one implementation, the modified workfunction metal layer 302 may be formed by sputtering from an alloy target, where the alloy target includes the desired workfunction metal and the desired noble metal. In an alternate implementation, an ALD process may be used where pulses of a workfunction metal precursor are alternated with pulses of a noble metal precursor.

Turning to FIG. 4B, the high-k gate dielectric layer 102, the modified workfunction metal layer 302, the barrier layer 106, and the gate electrode layer 108 are etched to form a transistor gate stack. Spacers 110 are formed adjacent to the gate stack, source and drain regions 116 are formed in the substrate 100, and an ILD layer 112 is deposited and planarized over the structure.

Finally, turning the FIG. 4C, an annealing process is carried out in the presence of molecular hydrogen or deuterium. The annealing process may take place at a temperature that falls between 400° C. and 950° C. for a time duration that ranges from 5 seconds to 120 seconds. The hydrogen or deuterium may be introduced into the reactor at a flow rate that ranges from 5000 SCCM to 15000 SCCM.

During the annealing process, at least a portion of the molecular hydrogen or deuterium diffuses into the transistor gate and passes through the modified workfunction metal layer 302. As the molecular hydrogen or deuterium contacts the noble metal catalyst, at least a portion of the molecular hydrogen or deuterium is converted into atomic hydrogen or deuterium. This atomic hydrogen or deuterium continues down to the high-k gate dielectric layer 102 where it combines with the reactive dangling bonds, rendering them passivated and substantially reducing their concentration. This quenching of the dangling bonds reduces the likelihood of device failure. Since the noble metal catalyst is alloyed into the workfunction metal layer 302, it remains as a permanent part of the high-k/metal gate transistor and is not removed after the annealing process is completed.

In an alternate implementation of the invention, the annealing process may be carried out immediately after deposition of the modified workfunction metal layer 302. For instance, the high-k gate dielectric layer 102 and the modified workfunction metal layer 302 may be deposited onto the substrate 100 and an annealing process may be carried out prior to deposition of the barrier layer 106. The anneal may occur in a molecular hydrogen or deuterium ambient. The noble metal in the modified workfunction metal layer 302 may convert the molecular hydrogen or deuterium into atomic hydrogen or deuterium that treats the high-k gate dielectric layer 102. In this implementation, the anneal may be followed by deposition of the barrier layer 106 and the gate electrode layer 108. The remainder of the transistor fabrication may follow a conventional process flow.

Turning now to FIG. 5A, another implementation of the invention is shown where a noble metal may be alloyed into a layer of the transistor gate stack to function as a catalyst. FIG. 5A shows a substrate 100 upon which a high-k gate dielectric layer 102, a workfunction metal layer 104, a modified barrier layer 304, and a gate electrode layer 108 are formed. The modified barrier layer 304 is a barrier layer formed by alloying a noble metal into the barrier layer material (e.g., titanium nitride or tantalum nitride), thereby placing the noble metal in close proximity to the high-k gate dielectric layer 102. In some implementations of the invention, the modified barrier layer 304 may be formed using a CVD or an ALD process. In some implementations, the modified barrier layer 302 may be formed by alloying any of the barrier materials listed above with a noble metal such as palladium or platinum. In one implementation, the modified barrier layer 304 may be formed by sputtering from an alloy target, where the alloy target includes the desired barrier metal and the desired noble metal. In an alternate implementation, an ALD process may be used where pulses of a bonier metal precursor are alternated with pulses of a noble metal precursor. This ALD process may use a nitrogen containing co-reactant and the pulses of the co-reactant may be attenuated over the course of the ALD process.

Turning to FIG. 5B, the high-k gate dielectric layer 102, the workfunction metal layer 104, the modified barrier layer 304, and the gate electrode layer 108 are etched to form a transistor gate stack. Spacers 110 are formed adjacent to the gate stack, source and drain regions 116 are formed in the substrate 100, and an ILD layer 112 is deposited and planarized over the structure.

Finally, turning the FIG. 5C, an annealing process is carried out in the presence of molecular hydrogen or deuterium. The annealing process may take place at a temperature that falls between 400° C. and 950° C. for a time duration that ranges from 5 seconds to 120 seconds. The hydrogen or deuterium may be introduced into the reactor at a flow rate that ranges from 5000 SCCM to 15000 SCCM.

During the annealing process, at least a portion of the molecular hydrogen or deuterium diffuses into the transistor gate and passes through the modified barrier layer 304. As the molecular hydrogen or deuterium contacts the noble metal catalyst, at least a portion of the molecular hydrogen or deuterium is converted into atomic hydrogen or deuterium. This atomic hydrogen or deuterium is delivered down to the high-k gate dielectric layer 102 where it combines with the reactive dangling bonds, rendering them passivated and substantially reducing their concentration. This quenching of the dangling bonds reduces the likelihood of device failure. Since the noble metal catalyst is alloyed into the barrier layer 304, it remains as a permanent part of the high-k/metal gate transistor and is not removed after the annealing process is completed.

In an alternate implementation of the invention, the annealing process may be carried out immediately after deposition of the modified barrier layer 304. For instance, the high-k gate dielectric layer 102, the workfunction metal layer 104, and the modified barrier layer 304 may be deposited onto the substrate 100 and an annealing process may be carried out prior to deposition of the gate electrode layer 108. The anneal may occur in a molecular hydrogen or deuterium ambient. The noble metal in the modified barrier layer 304 may convert the molecular hydrogen or deuterium into atomic hydrogen or deuterium that treats the high-k gate dielectric layer 102. In this implementation, the anneal may be followed by deposition of the gate electrode layer 108. The remainder of the transistor fabrication may follow a conventional process flow.

Turning now to FIG. 6A, yet another implementation of the invention is shown where a noble metal may be alloyed into a layer of the transistor gate stack to function as a catalyst. FIG. 6A shows a substrate 100 upon which a modified high-k gate dielectric layer 306, a workfunction metal layer 104, a barrier layer 106, and a gate electrode layer 108 are formed. The modified high-k gate dielectric layer 306 is a high-k dielectric layer that has been alloyed with a noble metal, thereby placing the noble metal in direct contact with the high-k gate dielectric material. In some implementations of the invention, the modified high-k gate dielectric layer 306 may be formed using a CVD or an ALD process. In some implementations, the modified high-k gate dielectric layer 306 may be formed by alloying any of the high-k materials listed above with a noble metal such as palladium or platinum. In one implementation, the modified high-k gate dielectric layer 306 may be formed by sputtering from an alloy target, where the alloy target includes the desired high-k gate dielectric material and the desired noble metal. In an alternate implementation, an ALD process may be used where pulses of a high-k dielectric precursor are alternated with pulses of a noble metal precursor.

Turning to FIG. 6B, the modified high-k gate dielectric layer 306, the workfunction metal layer 104, the barrier layer 106, and the gate electrode layer 108 are etched to form a transistor gate stack. Spacers 110 are formed adjacent to the gate stack, source and drain regions 116 are formed in the substrate 100, and an ILD layer 112 is deposited and planarized over the structure.

Finally, turning the FIG. 6C, an annealing process is carried out in the presence of molecular hydrogen or deuterium. The annealing process may take place at a temperature that falls between 400° C. and 950° C. for a time duration that ranges from 5 seconds to 120 seconds. The hydrogen or deuterium may be introduced into the reactor at a flow rate that ranges from 5000 SCCM to 15000 SCCM.

During the annealing process, at least a portion of the molecular hydrogen or deuterium diffuses into the transistor gate and reaches the modified high-k gate dielectric layer 306. As the molecular hydrogen or deuterium contacts the noble metal catalyst, at least a portion of the molecular hydrogen or deuterium is converted into atomic hydrogen or deuterium. This atomic hydrogen or deuterium then combines with the reactive dangling bonds, rendering them passivated and substantially reducing their concentration. This quenching of the dangling bonds reduces the likelihood of device failure. Since the noble metal catalyst is alloyed into the high-k gate dielectric layer 306, it remains as a permanent part of the high-k/metal gate transistor and is not removed after the annealing process is completed.

In an alternate implementation of the invention, the annealing process may be carried out immediately after deposition of the modified high-k gate dielectric layer 306. For instance, the modified high-k gate dielectric layer 306 may be deposited onto the substrate 100 and an annealing process may be carried out prior to deposition of the workfunction metal layer 104. The anneal may occur in a molecular hydrogen or deuterium ambient. The noble metal in the modified high-k gate dielectric layer 306 may convert the molecular hydrogen or deuterium into atomic hydrogen or deuterium that treats the high-k gate dielectric layer 306. In this implementation, the anneal may be followed by deposition of the workfunction metal layer 104, the barrier layer 106, and the gate electrode layer 108. The remainder of the transistor fabrication may follow a conventional process flow.

Accordingly, a novel process for improving the reliability of a high-k gate dielectric layer has been disclosed. Implementations of the invention improve the reliability of the high-k/metal gate transistor using atomic hydrogen or deuterium that is delivered via a noble metal catalyst layer. Improving the high-k gate dielectric layer increases the lifetime of the transistor and allows for further transistor scaling.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
   forming a high-k gate dielectric layer on a substrate;
   forming a workfunction metal layer over the high-k gate dielectric layer;
   forming a barrier metal layer on the workfunction metal layer;
   forming a gate electrode over the barrier metal layer; and
   treating the high-k gate dielectric layer with atomic hydrogen;
   wherein one of the high-k gate dielectric layer, the workfunction metal layer, and the barrier metal layer includes a noble metal to aid the atomic hydrogen treatment.

2. The method of claim 1, wherein the atomic hydrogen comprises atomic deuterium.

3. A transistor comprising:
   a high-k gate dielectric layer formed on a substrate, wherein the high-k gate dielectric layer has been treated with atomic hydrogen;
   a workfunction metal layer formed atop the a high-k gate dielectric layer;
   a barrier metal layer formed atop the workfunction metal layer;
   a gate electrode formed atop the barrier metal layer; and
   a noble metal incorporated into a layer of the transistor to aid the atomic hydrogen treatment.

4. The transistor of claim 3, wherein the noble metal is incorporated into the high-k gate dielectric layer.

5. The transistor of claim 3, wherein the noble metal is incorporated into the workfunction metal layer.

6. The transistor of claim 3, wherein the noble metal is incorporated into the barrier metal layer.

7. The transistor of claim 3, wherein the high-k gate dielectric layer comprises at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

8. The transistor of claim 3, wherein the workfunction metal layer comprises at least one of hafnium, zirconium, titanium, tantalum, aluminum, titanium carbide, zirconium carbide, tantalum carbide, hafnium carbide, aluminum carbide, ruthenium, palladium, platinum, cobalt, nickel, and ruthenium oxide.

9. The transistor of claim 3, wherein the barrier layer comprises at least one of titanium nitride and tantalum nitride.

10. The transistor of claim 3, wherein the gate electrode comprises at least one of polysilicon or aluminum.

11. The transistor of claim 3, further comprising:
    a pair of spacers formed on laterally opposite sides of the high-k gate dielectric layer;

a source region formed in the substrate adjacent to the high-k gate dielectric layer; and a drain region formed in the substrate adjacent to the high-k gate dielectric layer.

12. The transistor of claim 3, wherein the high-k gate dielectric layer has been treated with atomic deuterium.

* * * * *